(12) United States Patent  (10) Patent No.: US 7,790,492 B1
Baumhauer, Jr. et al.  (45) Date of Patent: Sep. 7, 2010

(54) METHOD FOR FABRICATING A TRANSDUCER PACKAGE WITH THE TRANSDUCER DIE UNSUPPORTED BY A SUBSTRATE

(75) Inventors: John Charles Baumhauer, Jr., Indianapolis, IN (US); Alan Dean Michel, Fishers, IN (US); Joshua R. Barber, New Castle, IN (US); Christopher Todd Welsh, Fishers, IN (US); Jeffrey Phillip McAteer, Carmel, IN (US)

(73) Assignee: MWM Acoustics, LLC, Indianapolis, IN (US)

( * ) Notice: Subject to any disclaimer, the term of this patent is extended or adjusted under 35 U.S.C. 154(b) by 0 days.

(21) Appl. No.: 12/583,364

(22) Filed: Aug. 18, 2009

Related U.S. Application Data

(63) Continuation of application No. 12/543,309, filed on Aug. 18, 2009.

(60) Provisional application No. 61/268,429, filed on Jun. 13, 2009.

(51) Int. Cl.
*H01L 21/00* (2006.01)
*H01L 21/44* (2006.01)
*H01L 21/48* (2006.01)
*H01L 21/50* (2006.01)

(52) U.S. Cl. ............... 438/51; 438/126; 438/669; 257/E23.133

(58) Field of Classification Search ............ 438/51, 438/126, 669; 257/E23.133
See application file for complete search history.

(56) References Cited

U.S. PATENT DOCUMENTS

| | | |
|---|---|---|
| 5,740,261 A | 4/1998 | Loeppert et al. |
| 6,781,231 B2 | 8/2004 | Minervini |
| 7,166,910 B2 | 1/2007 | Minervini |
| 7,242,089 B2 | 7/2007 | Minervini |
| 7,381,589 B2 | 6/2008 | Minervini |
| 7,382,048 B2 | 6/2008 | Minervini |
| 7,434,305 B2 | 10/2008 | Minervini |
| 7,436,054 B2 | 10/2008 | Zhe |
| 7,439,616 B2 | 10/2008 | Minervini |
| 2002/0101304 A1* | 8/2002 | Onishi et al. ............ 333/193 |
| 2005/0227415 A1* | 10/2005 | Farnworth et al. ........ 438/114 |

* cited by examiner

*Primary Examiner*—William M. Brewster
(74) *Attorney, Agent, or Firm*—Patent Law Office of David G. Beck

(57) ABSTRACT

A transducer package fabrication process is provided, the completed transducer package achieving a thin package profile. The fabrication process utilizes an encapsulation material to eliminate the need for a transducer support substrate, the encapsulation material isolating the terminal pads from one another while holding the transducer and signal processing IC in position.

22 Claims, 12 Drawing Sheets

US 7,790,492 B1

METHOD FOR FABRICATING A TRANSDUCER PACKAGE WITH THE TRANSDUCER DIE UNSUPPORTED BY A SUBSTRATE

CROSS-REFERENCE TO RELATED APPLICATION

This application is a continuation of U.S. patent application Ser. No. 12/543,309, filed Aug. 18, 2009, which claims the benefit of the filing date of U.S. Provisional Patent Application Ser. No. 61/268,429, filed Jun. 13, 2009, the disclosures of which are incorporated herein by reference for any and all purposes.

FIELD OF THE INVENTION

The present invention relates generally to a surface mountable package for a microelectromechanical system (MEMS) transducer and, more particularly, to a method of fabricating a transducer package designed to reduce package complexity and manufacturing costs.

BACKGROUND OF THE INVENTION

Miniature acoustic transducers, for example those fabricated using MEMS fabrication techniques, are used in a variety of applications such as stand-alone microphones, telephone handsets, cellular phones, hearing aids, and headsets. Typically such transducers, along with a microprocessor and interconnects, are mounted within a package that is designed to protect the transducer and associated components from manufacturing process extremes such as high temperature, handling and environmental damage, and electromagnetic interference in use, while providing a convenient means for mounting the device. Unfortunately, such transducer packages tend to be relatively complex due to the competing demands for an effective acoustic package that can also be fabricated in an efficient and cost effective manner.

Although there are a countless number of transducer package designs used in the industry, in general these packages include a substrate to which the transducer and associated components are mounted, and a protective cover attached to the substrate, the combination of which forms the transducer housing. Such a package, designed for use with a MEMS microphone, is disclosed in U.S. Pat. No. 6,781,231. In the disclosed MEMS package, the transducer housing is formed by electrically and mechanically coupling the cover, which includes a conductive layer, to the periphery of the substrate, which is at least partially covered by a conductive layer. The conductive layers shield the MEMS microphone from external electromagnetic interference.

U.S. Pat. No. 7,166,910 discloses a silicon condenser microphone package that includes a transducer unit, a substrate, and a cover. In at least one disclosed embodiment, the substrate of the package is comprised of a printed circuit board with at least one conductive layer and at least one insulating layer. The cover also includes a conductive layer which, in concert with the conductive layer of the printed circuit board, provides an electromagnetic interference shield. When attached to the substrate, the transducer overlaps at least a portion of a recess formed in the substrate, thereby forming a back volume for the transducer within the substrate.

Although there are a variety of transducer package designs and techniques for fabricating the same, these designs and techniques tend to be relatively complex and, due to the use of a mounting substrate, relatively large. Accordingly, what is needed is a transducer package that is simple to manufacture and achieves the desired performance in a small, thin package. The present invention provides such a design.

SUMMARY OF THE INVENTION

The present invention provides a surface mountable package for use with an MEMS transducer, the MEMS transducer being a MEMS microphone transducer, a MEMS speaker transducer, or a MEMS ultrasonic transducer. By using an encapsulation layer, the present invention achieves a thin package profile with a finished package height of preferably less than 0.85 mm, and more preferably less than 0.7 mm.

In at least one embodiment of the invention, a transducer package fabrication process is provided, comprised of the steps of applying an adhesive film layer to a production panel, bonding a sheet of terminal pad material to the adhesive film layer, defining a plurality of terminal pad sets, removing excess terminal pad material, attaching a signal processing IC to each transducer package, bonding a MEMS transducer to the adhesive film layer through a bonding window in each terminal pad set, positioning a production dam on the production panel, pouring encapsulation material into the encapsulation apertures, removing the production dam, attaching a cover to each transducer package, and separating the transducer packages from the production panel and into a plurality of individual transducer packages. A heat releasable adhesive may be selected for the adhesive film layer. Copper may be selected for the terminal pad material. Photo-etching may be used to define the terminal pad sets and remove the excess terminal pad material. The process may further comprise the step of plating the terminal pads, for example with a material, e.g., a metal such as tin or a tin alloy. The signal processing IC may be bonded to an inner surface of a terminal pad, or bonded to the adhesive film layer through a terminal pad window. The process may further comprise the step of heating the encapsulation material to a preset temperature, e.g., 50° C., for a preset time period, e.g., 3 hours, in order to accelerate encapsulation material curing. The material for the cover may be selected from the group consisting of metals (e.g., steel, tin-plated steel, copper, brass, nickel, aluminum, tin-plated aluminum, and copper-plated aluminum), conductive plastics, conductive composites, and non-conductive materials coated with at least one conductive layer. The process may further comprise the step of fabricating a port within the cover, for example an offset and displaced port. The cover attaching step may include the step of soldering an edge of the cover to the periphery of a terminal pad. The process may further comprise the step of releasing the transducer packages from the production panel, for example by heating the production panel and the transducer packages to a preset adhesive film release temperature.

A further understanding of the nature and advantages of the present invention may be realized by reference to the remaining portions of the specification and the drawings.

DESCRIPTION OF THE SPECIFIC EMBODIMENTS

The present invention provides a surface mountable package for use with a microelectromechanical system (MEMS) transducer. Although preferably the MEMS transducer is an audio transducer, such as a microphone transducer or a speaker transducer, the present invention is not limited to audio transducers. For example, the invention can also be used with a MEMS ultrasonic transducer. Lastly, identical element symbols used on multiple figures refer to the same component, or components of equal functionality. Additionally, the accompanying figures are only meant to illustrate, not limit, the scope of the invention and should not be considered to be to scale.

Transducer Package Structure

Figure 1:
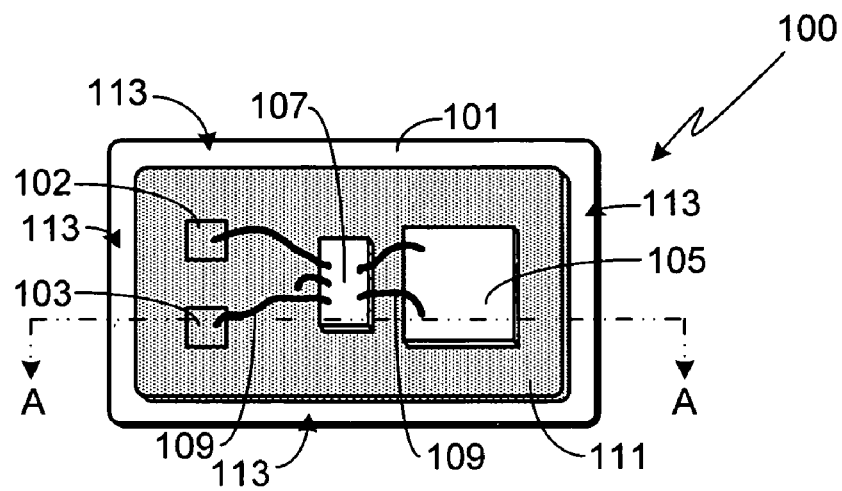
FIG. 1 provides a top, perspective view of a surface mountable transducer package with the cover removed.
Figure 2:
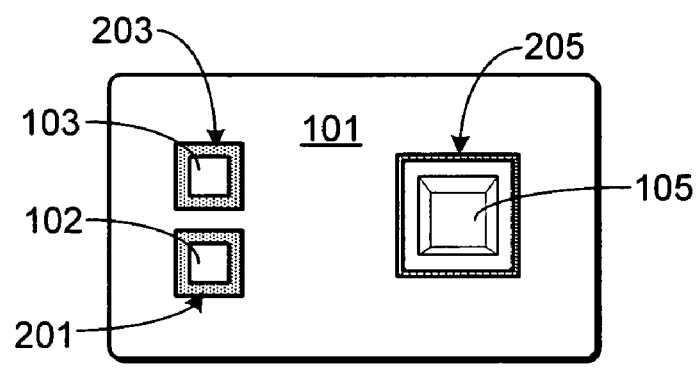
FIG. 2 provides a bottom, perspective view of the surface mountable transducer package of FIG. 1.
Figure 3:
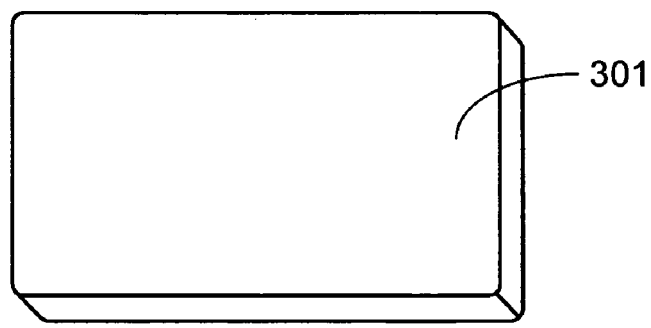
FIG. 3 is a perspective view of the transducer package of FIG. 1 with the cover in place.

FIGS. 1 and 2 provide top and bottom perspective views, respectively, of a preferred embodiment of the invention. FIG. 3 is an illustration of the same embodiment, with the transducer cover 301 in place. It should be understood that the embodiment shown in these figures is only an exemplary embodiment of the invention and that other embodiments and configurations are clearly envisioned by the inventors. For example, and as described further below, the inventors envision other port arrangements. The inventors also envision that the presently disclosed transducer package design may be used with both analog and digital circuitry.

As shown in FIGS. 1 and 2, the lowest layer of transducer package 100 is comprised of multiple terminal pads 101-103, the pads being fabricated from copper, gold-plated copper, tin-plated copper, tin/lead-plated copper, or other suitable material(s). As explained in further detail below, pads 101-103 are not part of a printed circuit board (PCB) or similar substrate, i.e., the terminal pads of the present invention are unsupported by a substrate or similar structure. The elimination of a substrate allows package 100 to achieve extremely low package heights. Transducer 105 is positioned such that the transducer aperture is viewable from the bottom, as shown in FIG. 2. Transducer 105 is a microelectromechanical system (MEMS) transducer, more preferably a MEMS microphone transducer, and still more preferably a silicon MEMS condenser microphone die. It should be understood, however, that transducer package 100 may also be used with other MEMS transducers, for example speaker or ultrasonic MEMS transducers.

Mounted to terminal pad 101 is an integrated circuit (IC) 107 that provides transducer signal processing, e.g., amplification. Preferably, IC 107 is bonded to the upper surface of terminal pad 101 as shown. IC 107 is coupled to transducer 105 and terminal pads 101-103 using a plurality of wire-bonds 109, as shown.

Covering the majority of the upper surface, i.e., the interior surface, of terminal pad 101, and all of the upper surfaces, i.e., the interior surfaces, of terminal pads 102/103, is an encapsulation material 111. In FIG. 1, encapsulant 111 is shown as semi-transparent, thus allowing the underlying structures to be visible. It should be understood, however, that encapsulant 111 may be transparent, semi-transparent, or opaque, depending upon the selected encapsulation material. As shown in FIG. 2, a region 201 of encapsulant 111 separates terminal pad 102 from terminal pad 101; a second region 203 of encapsulant 111 separates terminal pad 103 from terminal pad 101; and a third region 205 of encapsulant 111 separates transducer 105 from terminal pad 101. Encapsulant 111 only covers a portion of the sides of transducer 105, thus ensuring that the acoustic performance of the transducer is not compromised. Encapsulant 111 may cover a portion of IC 107 as shown, or it may cover the entire IC.

It will be appreciated that in a conventional transducer package, the transducer and the IC are positioned on top of the substrate, and thus are spaced apart from the terminal pads and/or the exterior package surface by a significant distance. In contrast, in the present invention the transducer is positioned within a transducer window in the lowermost device layer, e.g., terminal 101, and therefore is not spaced apart from the exterior package surface. Similarly, in the present invention the IC is bonded to the surface of a terminal pad or is positioned within an IC window within the terminal as discussed further below. As a result of this configuration, a transducer package in accordance with the present invention can achieve much smaller package dimensions than those achievable by a conventional design. Preferably, the overall height of the finished transducer package is less than 0.85 mm, and more preferably less than 0.7 mm. In one preferred embodiment, the dimensions of the finished transducer package are 0.65 mm (height)×3.78 mm (length)×2.95 mm (width).

Cover 301 is designed to be mechanically attached to the transducer assembly by coupling the cover to terminal pad 101, and more preferably by coupling the edge of the cover to a peripheral portion 113 of terminal pad 101. In addition, preferably cover 301 is fabricated from a conductive material, or includes a conductive layer, or is coated with a conductive material, the conductive cover/layer/coating being electrically connected to portion 113 of terminal pad 101, thereby providing a shield against electromagnetic interference. Cover 101 may be fabricated from any of a variety of materials, and may be comprised of a single material or multiple materials. Exemplary materials for cover 301 include a metal (e.g., steel, tin-plated steel, copper, aluminum, tin- or copper-plated aluminum, brass, nickel, etc.), a conductive plastic or composite (e.g., a polymer that has been doped, embedded, or otherwise formed such that it contains a conductive material such as carbon powder/fibers, metallic powder, etc.), or a non-conductive material (e.g., plastic) that has been coated with a conductive material on either, or both, of its inner and outer surfaces.

Figure 4:
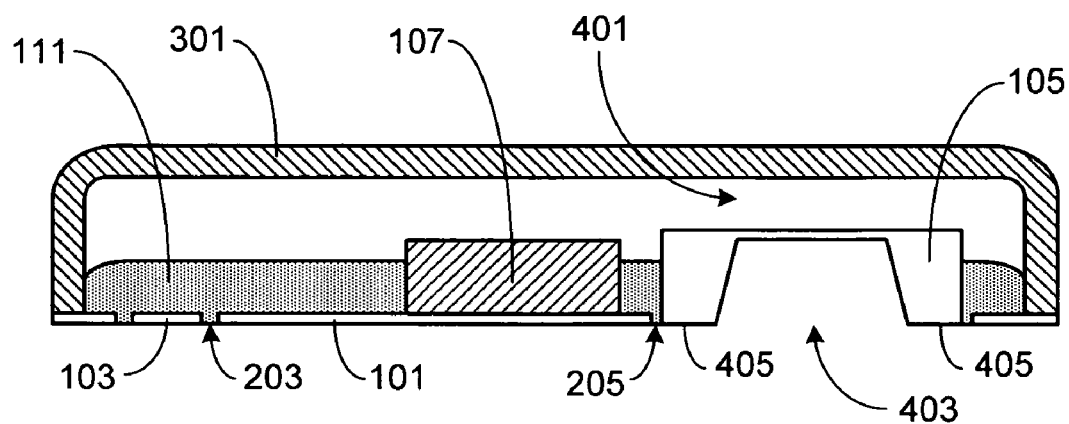
FIG. 4 is a cross-sectional view of an assembled package in accordance with the embodiment shown in FIGS. 1-3.

FIG. 4 provides a cross-sectional view of an assembled transducer package, taken along plan A-A of FIG. 1. This view includes cover 301, but does not include any wire bonds 109. In the exemplary embodiment, transducer 105 is mounted face up as shown. As such, volume 401, bounded by cover 301, comprises the acoustic chamber volume. Clearly the size of this acoustic chamber volume can be easily controlled by varying the thickness of encapsulation layer 111 or the dimensions of cover 301, specifically the separation distance between the inner surface of cover 301 and the upper surfaces of the components comprising the assembly, e.g., transducer 105, IC 107, and encapsulant 111. This view also clearly shows the acoustic aperture 403 of transducer 105 as well as the edges 405 of transducer 105 extending to, and comprising a portion of, an exterior surface of the transducer package as preferred. If desired, and as used in an alternate embodiment, transducer 105 may include a protective cap that covers acoustic aperture 403, thus preventing possible damage during handling, etc. Depending upon cap design, in such an embodiment edges 405 may not extend to the exterior surface of the transducer package. It will be appreciated that if the protective cap is to be held in place both during fabrication and package use, and if a bottom-port design is used as described further below (e.g., FIG. 8) or a top-ported design with an extension of the rear acoustic cavity into the end-user's mounting substrate (e.g., FIG. 7), then the protective cap includes means that would allow satisfactory acoustic communication through the cap, for example through the use of a porous cap material or by fabricating one or more holes through the cap.

Figure 5:
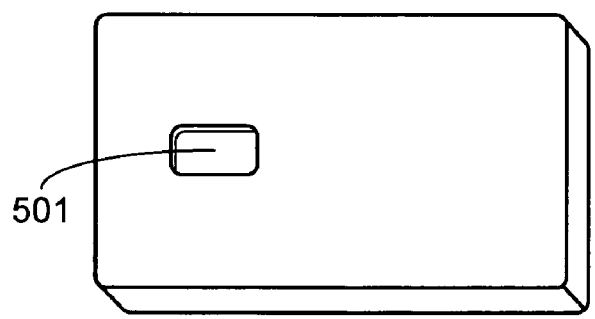
FIG. 5 is a perspective view of a ported cover.
Figure 6:
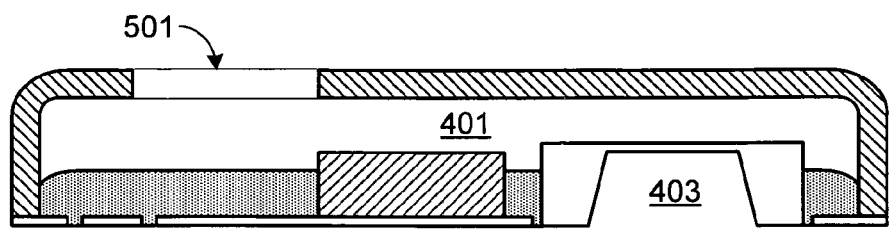
FIG. 6 is a cross-sectional view of an assembled package with a ported cover.
Figure 7:
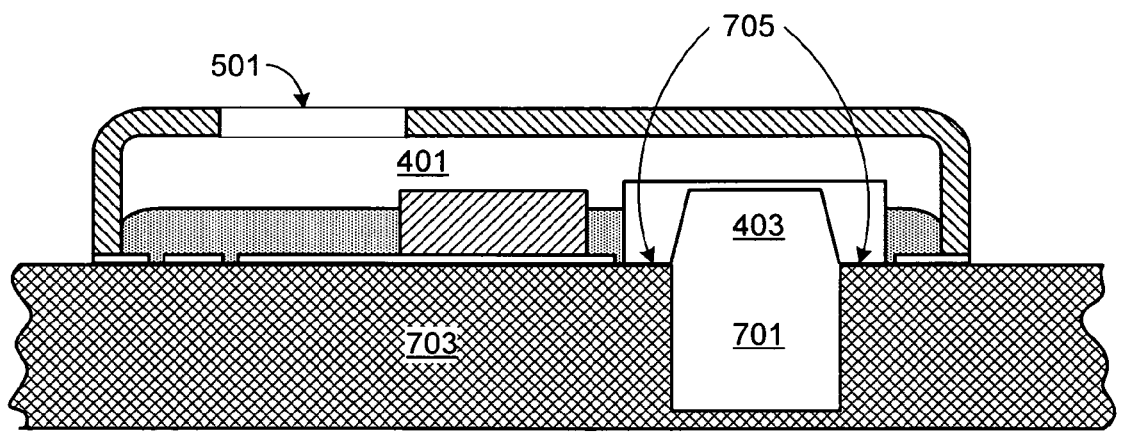
FIG. 7 is a cross-sectional view of the assembled package shown in FIG. 6, attached to an end-user PCB, the end-user PCB including a cavity that increases the electroacoustic sensitivity of the transducer package.

It will be appreciated that a transducer package in accordance with the invention can utilize any of a variety of different porting configurations. For example, the package can utilize a top-ported design by locating a port 501 in the cover as shown in FIGS. 5 and 6. In this configuration and as shown, preferably acoustic port 501 is not located directly above transducer 105 after package assembly. Displacing acoustic port 501 relative to transducer 105 provides additional protection to the transducer during manufacturing, handling, installation and operation. In this configuration, acoustic chamber volume 401 forms the front acoustic cavity for the transducer diaphragm. Note that in this configuration if the end user's mounting structure, e.g., an end-user PCB substrate, abuts the bottom surface of the transducer package, the rear acoustic cavity will be formed by the transducer aperture 403 and bounded by the end-user's mounting substrate. As such, the rear acoustic cavity will be quite small relative to the front acoustic cavity. To increase the electroacoustic sensitivity of the transducer package, the rear acoustic cavity may be increased by fabricating a cavity 701 within the end-user's mounting substrate 703 that abuts transducer aperture 403 as shown in FIG. 7. Preferably the surface of the end-user's substrate 703 surrounding cavity 701 is sealed to the perimeter 705 of the transducer die, thereby forming an acoustically sealed cavity.

Figure 8:
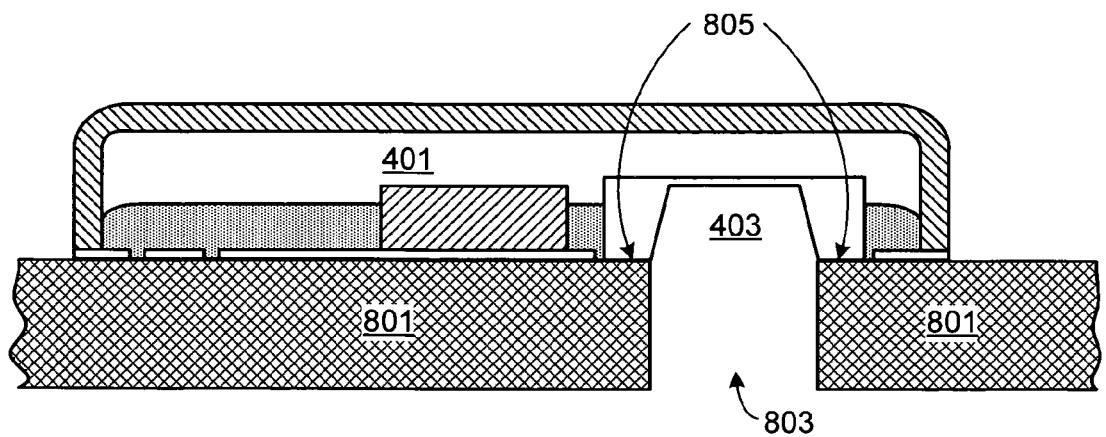
FIG. 8 is a cross-sectional view of the assembled package shown in FIG. 4, attached to an end-user PCB, the end-user PCB including a sound channel.

In an alternate preferred configuration, the package utilizes a bottom-port design, providing direct access to transducer aperture 403 which serves as the sound port. As a consequence, cover 301 does not include any ports, thus appearing as shown in FIGS. 1-4. This configuration yields a higher electroacoustic sensitivity than the top-ported design shown in FIGS. 5 and 6 since the large acoustic chamber volume 401 forms the rear acoustic cavity for the transducer diaphragm. FIG. 8 shows such a typical mounting arrangement utilizing a bottom-ported package in which the transducer package is attached to an end-user's PCB substrate 801 that includes a sound channel 803 leading to the transducer aperture 403. As in the previous embodiment, preferably end-user substrate 801 is acoustically sealed around the perimeter 805 of the transducer die.

Figure 9:
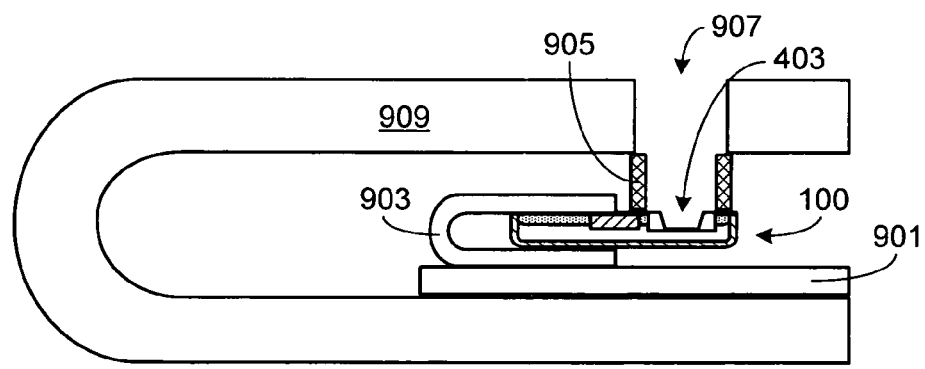
FIG. 9 is a cross-sectional view of the assembled package shown in FIG. 4, attached to a device structure and housing via a flexible PCB member.

It will be appreciated that the advantages offered by a bottom-ported package can be achieved without including a sound channel within the end-user's PCB substrate. For example and as shown in FIG. 9, transducer package 100 can be mounted to the end-user's PCB substrate 901 using a secondary, flexible PCB member 903 or similar means. Flexible PCB member 903 may cover only a portion of the lower and/or upper package surfaces, for example leaving the acoustic aperture uncovered as illustrated. If desired, flexible PCB member 903 may be fabricated as an integral part of the end-user's PCB substrate 901. Preferably PCB member 903 is bent in an arc with an included angle of at least 30 degrees. Utilizing the illustrated approach, or a similar approach, allows the transducer package to be offset from the end-user's PCB mounting substrate. In the exemplary configuration, a microphone boot 905 couples the transducer aperture 403 to the sound hole(s) 907 within the device housing 909.

Figure 10:
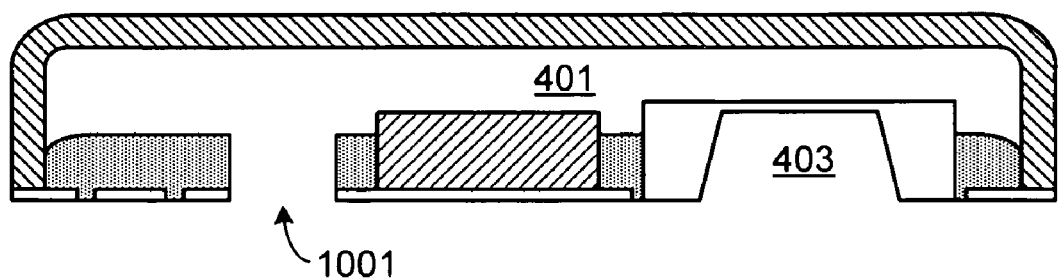
FIG. 10 is a cross-sectional view of an assembled package utilizing a pair of displaced sound ports.

In an alternate port configuration, a gradient-type directional or noise-canceling microphone is formed by including a pair of displaced sound ports, the first port coupled to acoustic chamber volume 401 and the second port coupled to the transducer aperture, for example via sound channel 803. It will be appreciated that the port coupled to acoustic chamber volume 401 may be located in the cover, such as previously described port 501, or formed through terminal pad 101 and encapsulant layer 111, e.g., port 1001 in FIG. 10.

Figure 11:
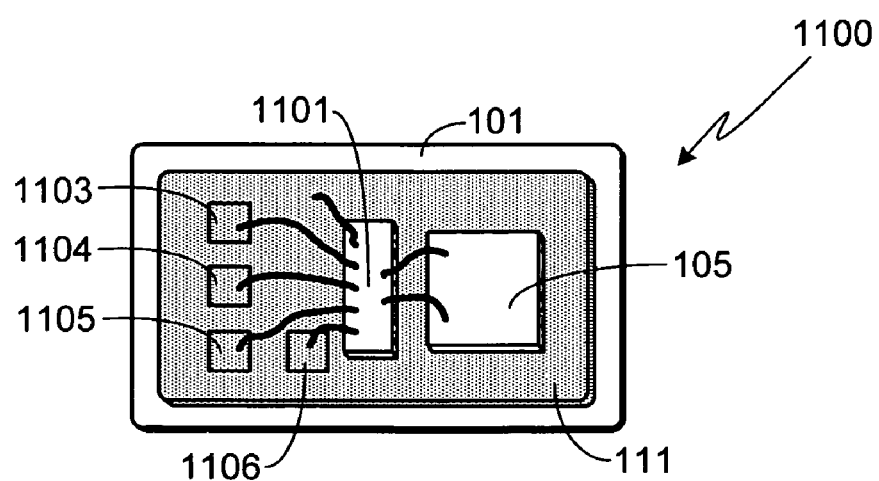
FIG. 11 provides a top, perspective view of a surface mountable transducer package with the cover removed, the package including a digital signal processing IC.

As previously noted, the present invention can be used with various signal processing schemes. For example, FIG. 11 illustrates a top level view of an embodiment similar to that shown in FIG. 1 except for the inclusion of a digital processing IC 1101. It will be understood that during final assembly, a cover is added to the package as previously described, and that any of the previously described port arrangements can be used with assembly 1100. IC 1101 typically requires more terminal pads than the previously described embodiment. For example, preferably assembly 1100 includes four terminal pads 1103-1106 in addition to terminal pad 101 as shown.

Transducer Package Fabrication

To further clarify the distinctions between the present transducer package and a conventional assembly, a preferred device manufacturing process is described below. It should be appreciated, however, that other techniques may be used to manufacture the transducer package of the invention.

Figure 12:
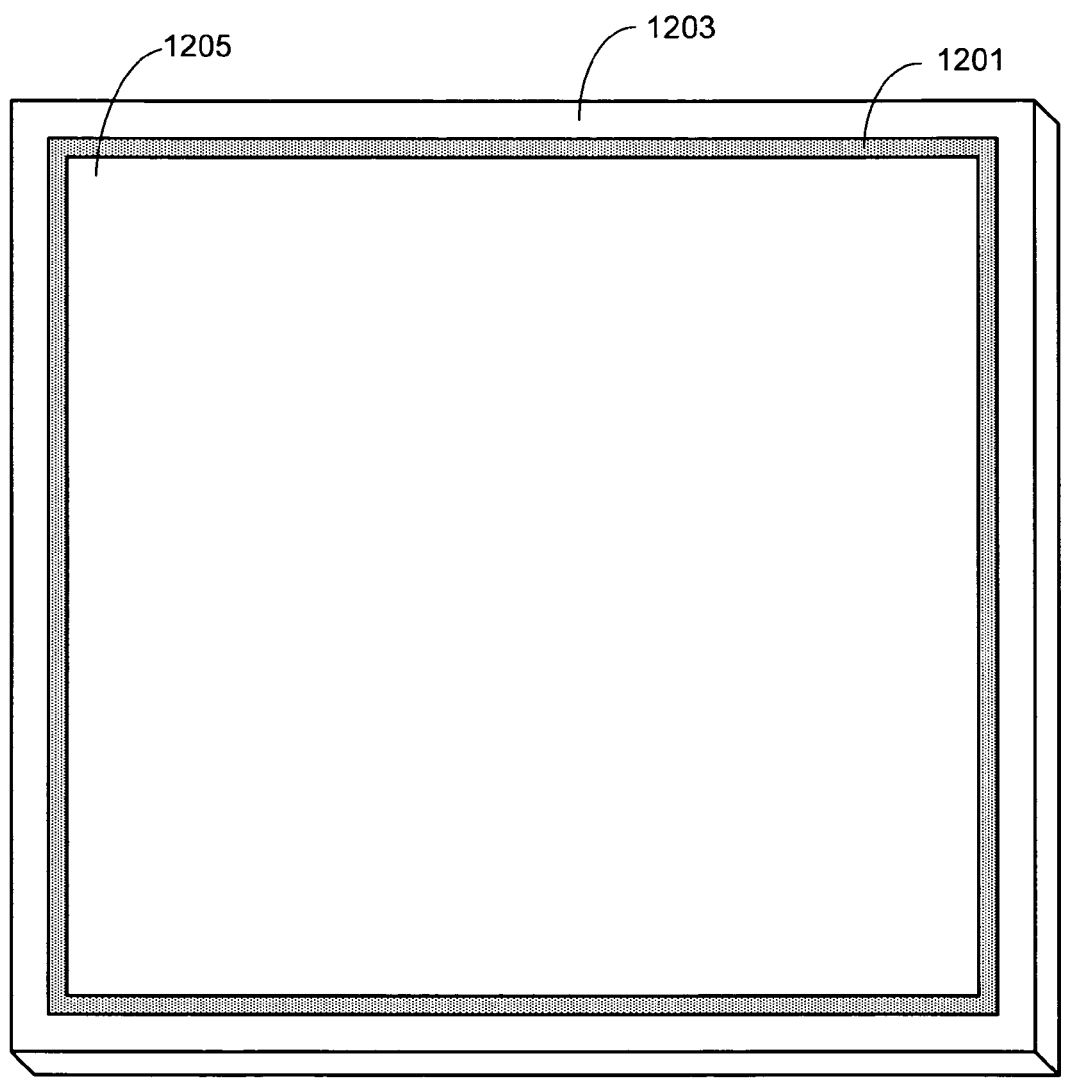
FIG. 12 illustrates a production panel with an adhesive layer and a sheet of terminal pad material attached.

As illustrated in FIG. 12, initially an adhesive film 1201 is applied to the surface of a suitable production panel 1203. Production panel 1203 is capable of being used in a high temperature environment, the temperature requirements determined by the materials and the processing steps used during device fabrication. The working surface of production panel 1203 is polished flat. In the preferred embodiment, panel 1203 is fabricated from glass. Adhesive film 1201 is a temporary adhesive, i.e., used to hold the elements of the transducer assembly in place during fabrication, but then releasable by means of heat, a chemical agent, or other means. In the preferred embodiment, adhesive film 1201 is comprised of a heat-releasing adhesive such as AD 4010 manufactured by Valtech Corporation, this adhesive being a two component epoxy that releases at 90° C. and leaves no films or residues on the bonded surfaces of either the production panel or the exterior of the transducer package.

Figure 13:
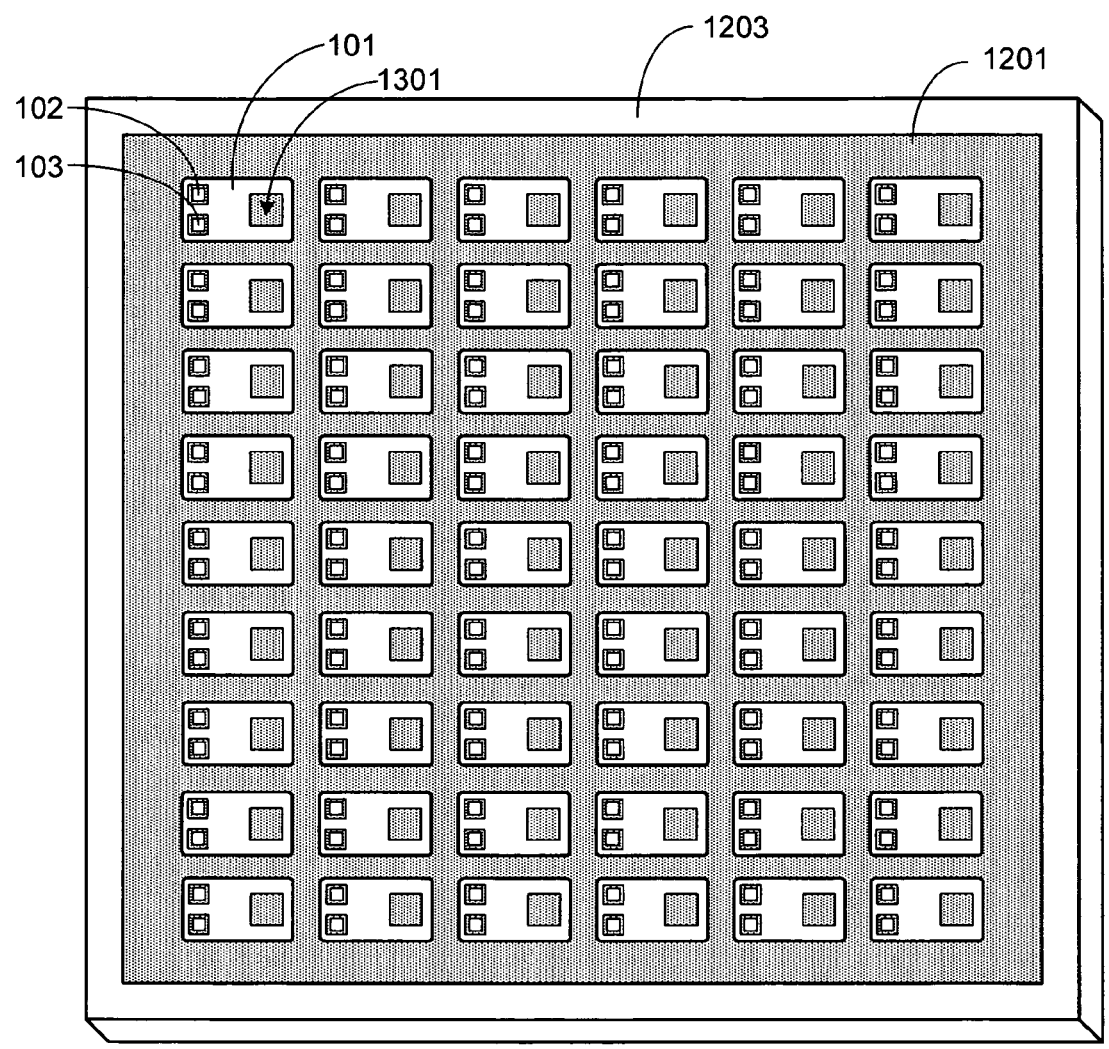
FIG. 13 illustrates the terminal pad material shown in FIG. 12 after photo-etching.

Bonded to production panel 1203 by adhesive film 1201 is a sheet of material 1205 suitable for use as the terminal pads. Preferably sheet 1205 is comprised of copper. Then, using a photo-etching or similar process, excess material from sheet 1205 is removed, leaving behind the terminal pads for a plurality of devices as shown in FIG. 13. Due to the use of adhesive 1201, the terminal pads remain in place. Preferably the terminal pads are then plated, for example with gold, tin or a tin alloy (e.g., tin/lead, tin/zinc), thus facilitating the wire bonding process. Preferably an electroless process is used during the plating step.

Figure 14:
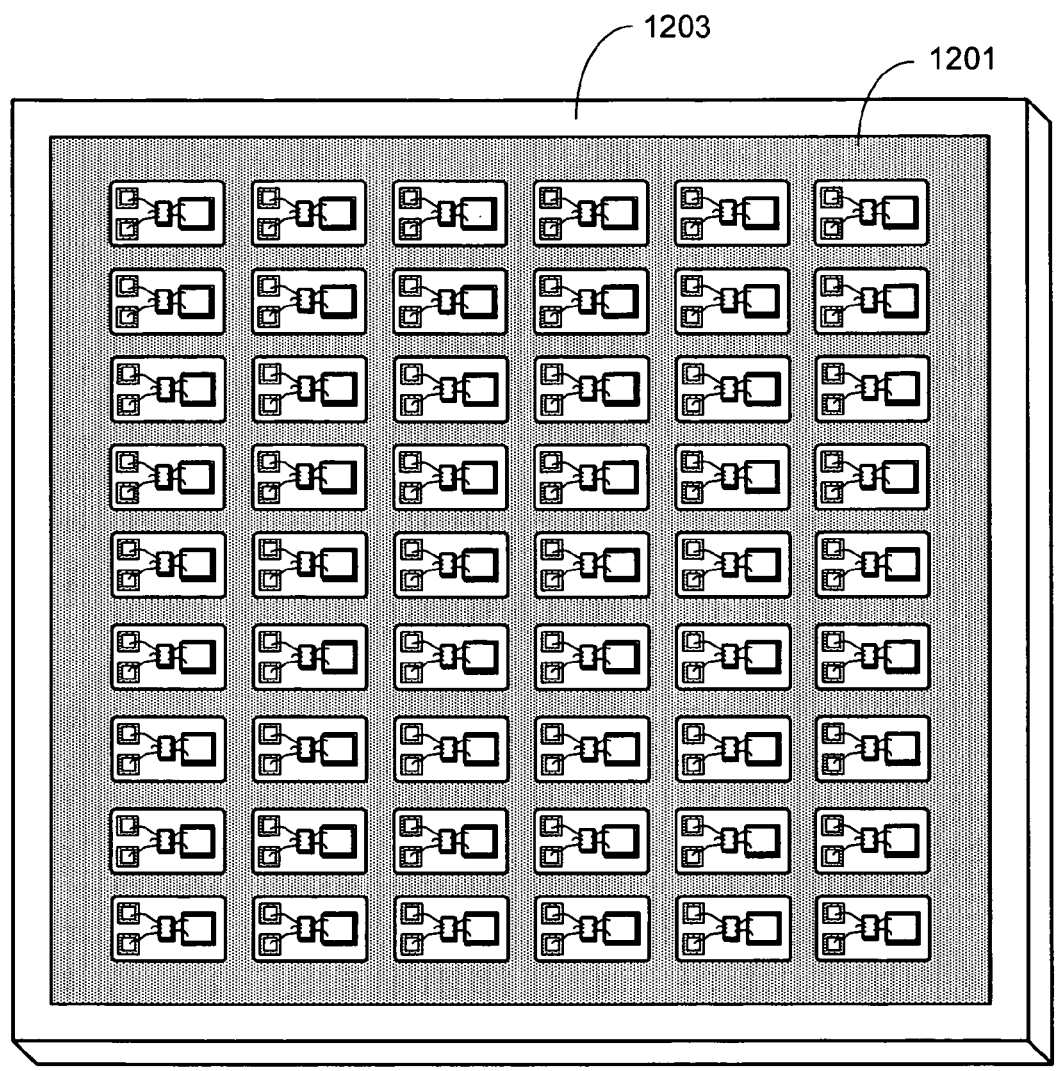
FIG. 14 illustrates the terminal pad assemblies shown in FIG. 13 after mounting and connecting the signal processing IC and the MEMS transducer to each assembly.

As illustrated in FIG. 14, the next processing steps attach a MEMS die 105 and an IC 107 to each assembly, and then wire bonds them to the appropriate terminal pads. As previously described and illustrated, the footprint of MEMS die 105 is smaller than that of transducer window 1301, thus allowing the die to be directly attached to the adhesive film within the window. In the illustrated embodiment, and as preferred, IC 107 is bonded to terminal pad 101. In an alternate embodiment, however, an IC window is formed during the etching step through which IC 107 is placed, thus allowing the IC to be directly attached to adhesive film layer 1201.

Figure 15:
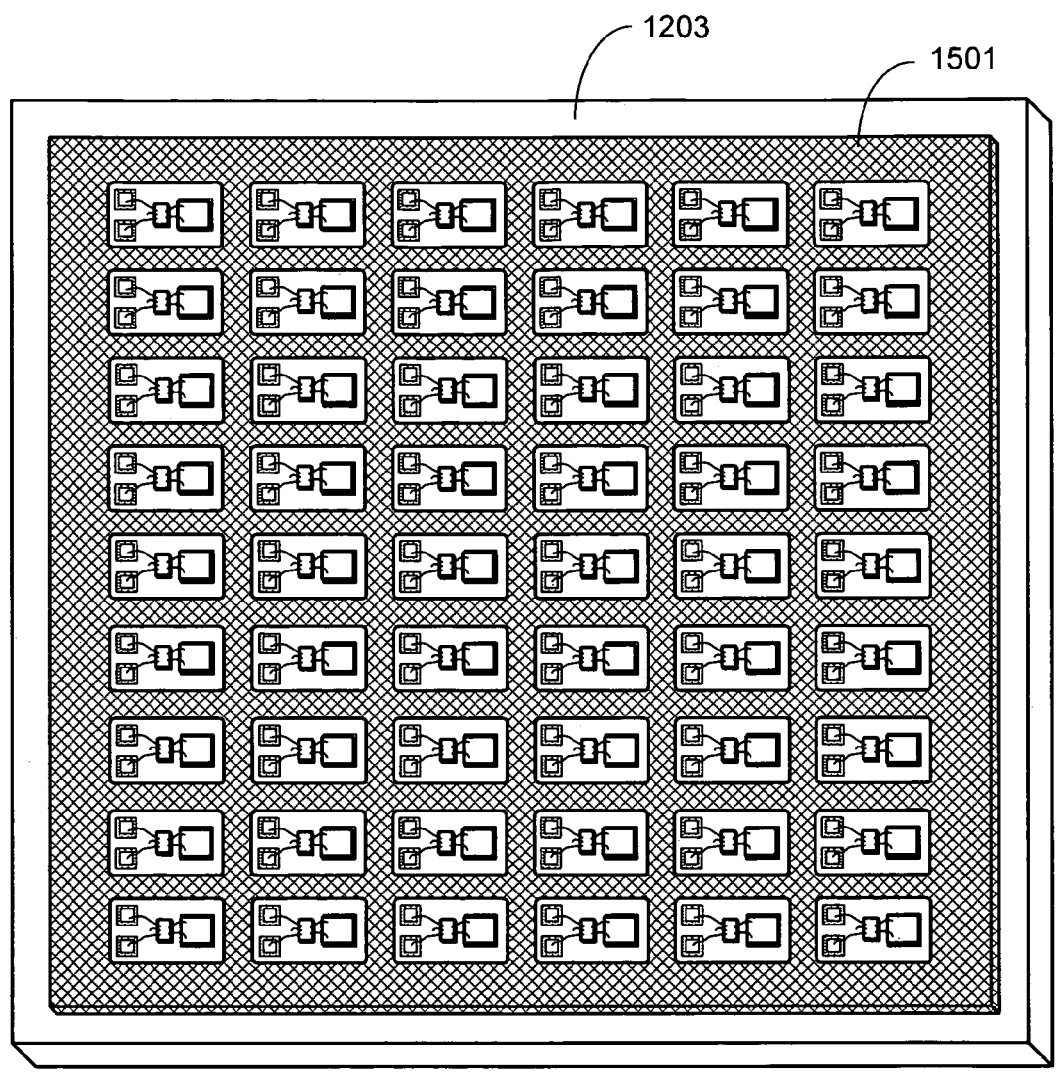
FIG. 15 illustrates the terminal pad assemblies shown in FIG. 14 after the production dam has been positioned relative to the assemblies.

In the next step, illustrated in FIG. 15, a production dam 1501 is positioned over the batch of devices, the production dam surrounding each device as shown. The production dam allows the previously described encapsulation material to be poured over each structure, the dam holding the encapsulation material in place during curing. Preferably production dam 1501 is fabricated from a material, such as Teflon®, that releases easily from the encapsulation material. Alternately, a release agent can be applied to the inside edges of the dam that surround each device structure.

Figure 16:
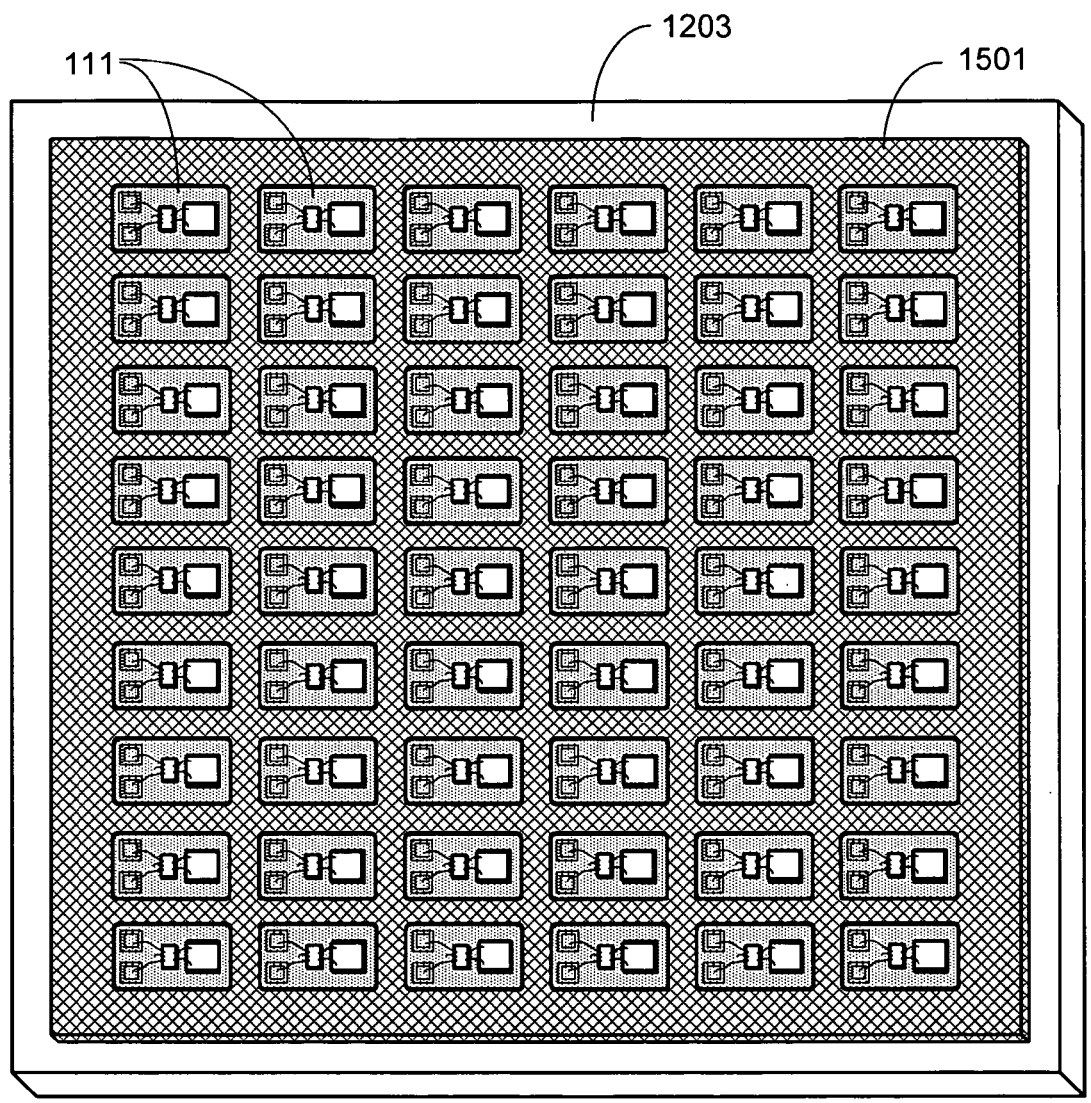
FIG. 16 illustrates the transducer assemblies after application of the encapsulation material.

Once the production dam is in place, encapsulation material 111 is poured within each dammed region, for example using a syringe, automated syringe-like instrument, or other means (FIG. 16). Preferably encapsulation material 111 is added such that it extends to approximately ⅔ the height of the MEMS transducer 105, i.e., so that approximately ⅓ of each MEMS die extends above the encapsulant layer. Depending upon the size, in particular the height, of IC 107, it may or may not extend above encapsulant 111. Additionally, and as previously noted relative to FIG. 2, the encapsulation material extends all of the way down to the adhesive layer between adjacent terminal pads, e.g., region 201 around terminal pad 102 and region 203 around terminal pad 103, and around MEMS die 105, e.g., region 205.

In the preferred embodiment of the invention, encapsulation material 111 is comprised of Penchem PT 365, which is a two-part black potting compound. The uncured material is self-leveling, with a viscosity of 1,190 centipoise, thus allowing it to be easily dispensed with a syringe or similar means. It has a long working time, on the order of an hour, and hardens at room temperature in 24 hours. Full hardness is achieved in 72 hours. Curing can be sped up, for example by curing at a temperature of 50° C. for 3 hours. Once cured, this material has a tensile strength of 689 kg cm$^{-2}$. It will be appreciated that there are numerous potting compounds that may be used for encapsulant 111. Preferably the selected encapsulation material will have (i) a sufficiently low uncured viscosity to be self-leveling and allow easy delivery of the compound into the regions dammed by the production dam; (ii) good wetting characteristics, thereby insuring adequate adhesion to the terminal pads, MEMS die, etc.; (iii) reasonable cure time, thus allowing efficient fabrication techniques to be employed; and (iv) high tensile strength of the cured material.

Figure 17:
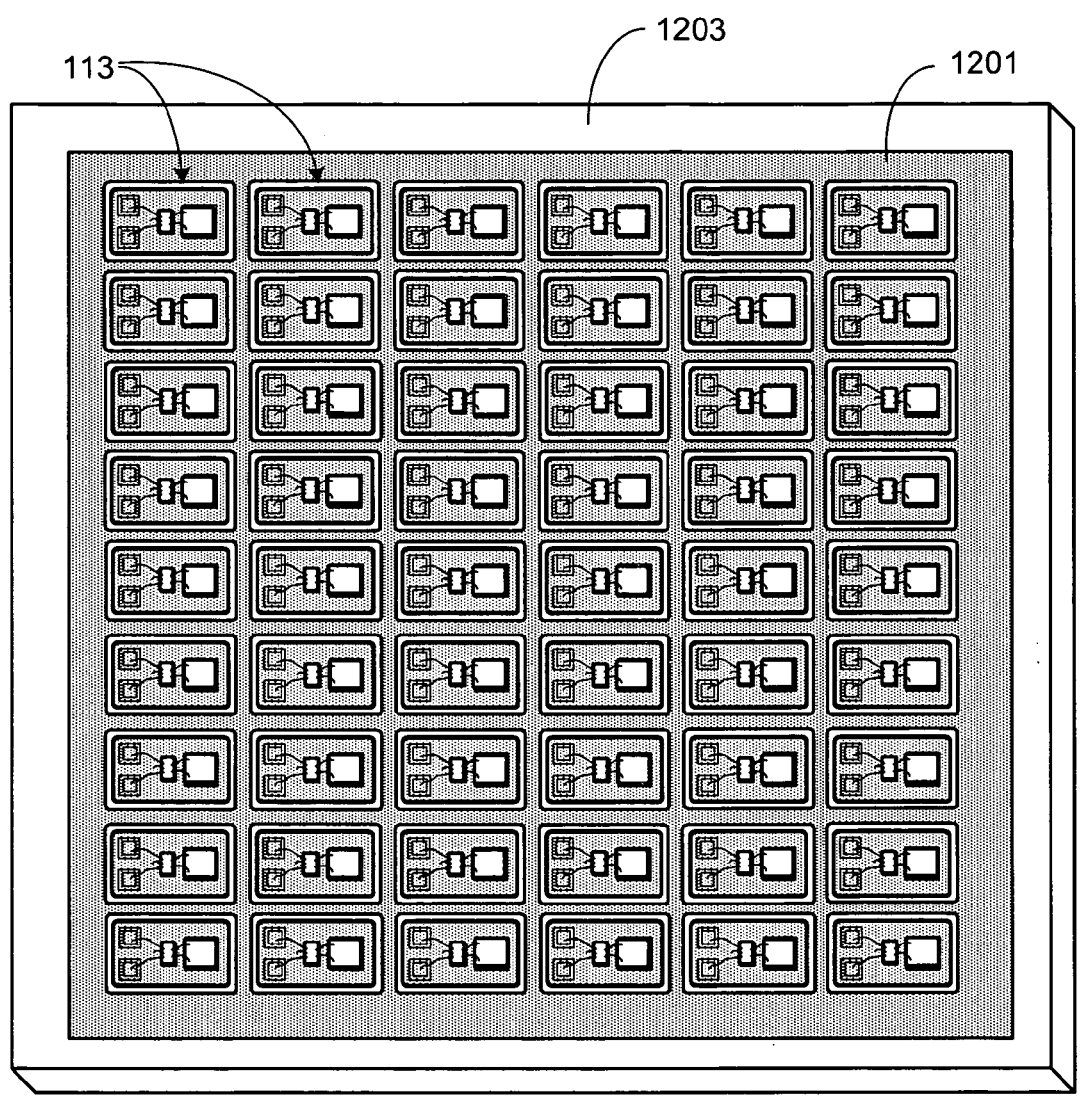
FIG. 17 illustrates the transducer assemblies after removal of the production dam.
Figure 18:
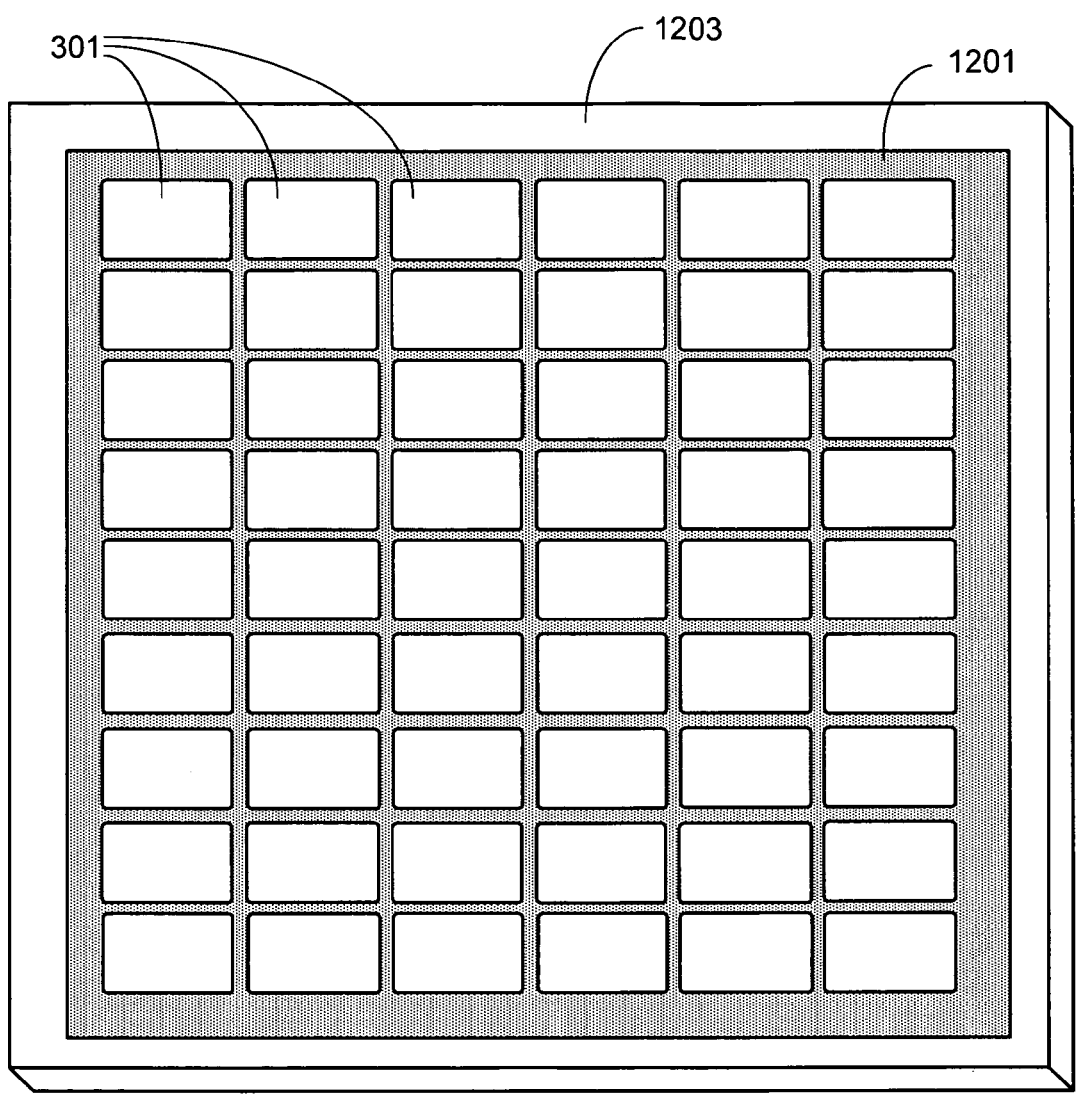
FIG. 18 illustrates the transducer assemblies after cover mounting.

After the encapsulation material has cured, production dam 1501 is removed, leaving the encapsulated devices in place. As shown in FIG. 17, edge portions 113 of each terminal pad 101 are clearly visible for each device, these edge portions having been protected by production dam 1501 during the encapsulation process. In the preferred embodiment, these edge portions are used to couple the covers 301 to the individual assemblies as previously described and as illustrated in FIG. 18. In this figure, covers 301 are shown as un-ported. In the preferred embodiment, covers 301 are metal, comprised, for example, of steel, tin-plated steel, copper, brass, nickel, aluminum, tin-plated aluminum, or copper-plated aluminum. Alternately, a conductive material or a non-conductive material with a conductive layer may be used for covers 301. Preferably a high temperature solder alloy paste, applied completely around the edges of each cover 301 and/or completely around portions 113 of terminal pads 101, is used to solder the covers in place. During the soldering process, e.g., a reflow process, covers 301 are mechanically coupled, and electrically connected, to edge portions 113 of terminal pads 101. As a result of this process, an acoustic seal is formed between the terminal pad edges and the covers for each assembly. Additionally, and assuming the use of an appropriate heat releasable adhesive, during this high temperature process the adhesive film layer 1201 loses its adhesive properties, releasing the transducer packages from the production panel.

In a variation of the preferred manufacturing process, the covers are applied to the device structures in batch form. The individual transducer packages are then separated, or separated after removal from the adhesive layer.

It will be appreciated that during fabrication, various mechanical, electrical and acoustical tests may be performed to assess device viability or performance and to monitor fabrication processing.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention.

What is claimed is:

1. A method of fabricating a transducer package, said method comprising the steps of:
   applying a layer of an adhesive film to a production panel;
   bonding a sheet of terminal pad material to said layer of adhesive film;
   defining a plurality of terminal pad sets on said sheet of terminal pad material, wherein each of said terminal pad sets corresponds to one of a plurality of transducer packages;
   removing excess terminal pad material from said sheet of terminal pad material, wherein excess terminal pad material is defined as terminal pad material other than the terminal pad material comprising said plurality of terminal pad sets;
   attaching a signal processing integrated circuit (IC) to each of said plurality of transducer packages;
   bonding a MEMS transducer to said layer of adhesive film through a transducer window within each of said plurality of terminal pad sets;
   electrically connecting said MEMS transducer to said signal processing IC for each of said plurality of transducer packages;

electrically connecting said signal processing IC to said terminal pad set for each of said plurality of transducer packages;

positioning a production dam on said production panel, said production dam comprised of a plurality of encapsulation apertures, wherein each of said plurality of encapsulation apertures surround at least a portion of each of said terminal pad sets corresponding to said plurality of transducer packages;

pouring encapsulation material into said plurality of encapsulation apertures;

removing said production dam;

attaching a cover to each of said plurality of transducer packages; and separating said plurality of transducer packages from said production panel and into a plurality of individual transducer packages.

2. The method of claim 1, further comprising the step of selecting a heat releasable adhesive for said adhesive film.

3. The method of claim 1, further comprising the step of selecting a copper sheet for said sheet of terminal pad material.

4. The method of claim 1, wherein a photo-etching process is used during said defining and excess terminal pad material removing steps.

5. The method of claim 1, further comprising the step of plating said plurality of terminal pad sets prior to said signal processing IC attaching step.

6. The method of claim 1, further comprising the step of plating said plurality of terminal pad sets with a metal material.

7. The method of claim 1, further comprising the step of plating said plurality of terminal pad sets with a material selected from the group consisting of tin and tin alloys, wherein said plating step is performed prior to said signal processing IC attaching step.

8. The method of claim 1, said signal processing IC attaching step further comprising the step of bonding said signal processing IC to an upper terminal pad surface for each of said plurality of transducer packages.

9. The method of claim 1, said signal processing IC attaching step further comprising the step of bonding said signal processing IC to said layer of adhesive film through an IC bonding window within each of said plurality of terminal pad sets.

10. The method of claim 1, wherein said encapsulation material pouring step further comprises the step of pouring sufficient encapsulation material into each of said plurality of encapsulation apertures to extend to approximately two thirds the height of said MEMS transducer.

11. The method of claim 1, further comprising the step of heating said encapsulation material to a preset temperature for a preset period of time, wherein said heating step is performed prior to said production dam removing step, and wherein said heating step accelerates encapsulation material curing.

12. The method of claim 11, further comprising the steps of selecting a preset temperature of at least 50° C. and selecting a preset period of time of at least 3 hours.

13. The method of claim 1, further comprising the step of selecting a material for said cover from the group consisting of metals, conductive plastics, conductive composites, and non-conductive materials coated with at least one conductive layer.

14. The method of claim 1, further comprising the step of selecting a metal for said cover from the group of metals consisting of steel, tin-plated steel, copper, brass, nickel, aluminum, tin-plated aluminum, and copper-plated aluminum.

15. The method of claim 1, further comprising the step of fabricating a port within said cover.

16. The method of claim 15, further comprising the step of offsetting and displacing said port relative to said MEMS transducer.

17. The method of claim 15, wherein said port fabricating step is performed prior to said cover attaching step.

18. The method of claim 1, said cover attaching step further comprising the step of soldering an edge of said cover to a peripheral portion of at least one terminal pad of each of said plurality of terminal pad sets.

19. The method of claim 18, wherein said peripheral portion of said at least one terminal pad of each of said plurality of terminal pad sets is covered by said production dam during said production dam positioning step.

20. The method of claim 1, said separating step further comprising the step of releasing said plurality of transducer packages from said production panel.

21. The method of claim 20, said releasing step further comprising the step of heating said production panel and said plurality of transducer packages to a preset adhesive film release temperature.

22. The method of claim 1, further comprising the step of adding a protective cap to said MEMS transducer prior to said step of bonding said MEMS transducer to said layer of adhesive film, wherein said protective cap covers an aperture of said MEMS transducer.

* * * * *